(12) United States Patent
Wright et al.

(10) Patent No.: US 11,887,806 B2
(45) Date of Patent: Jan. 30, 2024

(54) COMPOSITE ION SOURCE BASED UPON HETEROGENEOUS METAL-METAL FLUORIDE SYSTEM

(71) Applicant: Applied Materials, Inc., Santa Clara, CA (US)

(72) Inventors: Graham Wright, Newburyport, MA (US); Ryan C. Prager, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 118 days.

(21) Appl. No.: 17/715,690

(22) Filed: Apr. 7, 2022

(65) Prior Publication Data

US 2023/0326703 A1   Oct. 12, 2023

(51) Int. Cl.
  *H01J 37/08*  (2006.01)
  *H01J 37/317*  (2006.01)
  *C23C 14/48*  (2006.01)
  *H01J 37/05*  (2006.01)

(52) U.S. Cl.
  CPC .............. *H01J 37/08* (2013.01); *C23C 14/48* (2013.01); *H01J 37/05* (2013.01); *H01J 37/3171* (2013.01); *H01J 2237/0815* (2013.01)

(58) Field of Classification Search
  CPC ........ H01J 37/08; H01J 37/05; H01J 37/3171; H01J 2237/0815; C23C 14/48
  USPC ............... 250/423 R, 424, 425, 492.1–492.3
  See application file for complete search history.

(56) References Cited

U.S. PATENT DOCUMENTS

| | | |
|---|---|---|
| 2012/0255490 A1 | 10/2012 | Tanjo |
| 2013/0313971 A1 | 11/2013 | Biloiu |
| 2013/0341568 A1 | 12/2013 | Sinha |
| 2014/0167612 A1 | 6/2014 | Perelman |
| 2021/0020403 A1* | 1/2021 | Murooka ............ H01J 37/3171 |

FOREIGN PATENT DOCUMENTS

WO   2019077970 A1   11/2019

OTHER PUBLICATIONS

International Search Report and Written Opinion for the International Application No. PCT/US2023/013477, dated Jun. 19, 2023, 9 pages.

* cited by examiner

*Primary Examiner* — Michael Maskell
(74) *Attorney, Agent, or Firm* — KDW Firm PLLC

(57) ABSTRACT

An ion source is provided. The ion source may include an ion chamber to generate an ion beam comprising a metal ion species; and a charge source, coupled to deliver a metal vapor to the ion chamber, the charge source including a charge mixture. The charge mixture may include a first portion, comprising an elemental metal; and a second portion, comprising a heterogeneous metal fluoride compound.

20 Claims, 4 Drawing Sheets

COMPOSITE ION SOURCE BASED UPON HETEROGENEOUS METAL-METAL FLUORIDE SYSTEM

FIELD

The present embodiments relate to ion sources, and more particularly, to ion sources for beamline ion implanters.

BACKGROUND

Ion sources are used to generate a variety of ion species including dopant ions that are used for implantation into semiconductor substrates to control their electronic properties. Current ion sources, for implanting species such as metallic species may employ a solid target to be etched by a plasma, in order to generate metal-containing ions, or alternatively, liquid metal that is contained within a crucible. These type of ion sources may generate modest ion current output due to limitations on the production of sufficient metallic vapor to be ionized in the ion source. Handling of materials in such sources may present a challenge. For example, metallic species (e.g., Ga, Ge, In, Al) may exhibit relatively low melting points, but high vapor pressures, making these materials difficult to operate in a known vaporizer. Current approaches that employ pure metal dopants for an ion source require a retractable crucible that is passively heated by the source, in order to obtain temperatures sufficiently high to generate metallic vapor, which vapor output is nevertheless low, limiting the resulting ion beam currents.

With respect to these and other considerations, the present disclosure is provided.

BRIEF SUMMARY

In one embodiment, an ion source is provided. The ion source may include an ion chamber to generate an ion beam comprising a metal ion species; and a charge source, coupled to deliver a metal vapor to the ion chamber, the charge source including a charge mixture. The charge mixture may include a first portion, comprising an elemental metal; and a second portion, comprising a heterogeneous metal fluoride compound.

In another embodiment, an ion implanter is provided. The ion implanter may include an ion source, configured to generate a metal ion beam comprising a plurality of metal ions. The ion source may include an ion chamber to generate an ion beam comprising a metal ion species; and a charge source, coupled to deliver a metal vapor to the ion chamber, the charge source comprising a charge mixture. The charge mixture may include a first portion, comprising an elemental metal; and a second portion, comprising a heterogeneous metal fluoride compound formed from a heterogeneous metallic element, different from the elemental metal. The ion implanter may further include a mass filter, disposed downstream of the ion source, and configured to filter out from the metal ion beam a set of impurity ions containing the heterogeneous metallic element.

In a further embodiment, a method of operating a metal ion source is provided. The method may include providing a charge mixture in a charge source, the charge source comprises a vaporizer or a retractable crucible. The charge mixture may include a first portion, comprising an elemental metal, and a second portion, comprising a heterogeneous metal fluoride compound in solid form. The method may include heating the charge mixture to an operating temperature, wherein the charge source generates a metal vapor comprising at least one metal sub-fluoride species, and generating metal ions in an ion chamber of the metal ion source, the metal ions being derived from the metal vapor.

DETAILED DESCRIPTION

Figure 1:
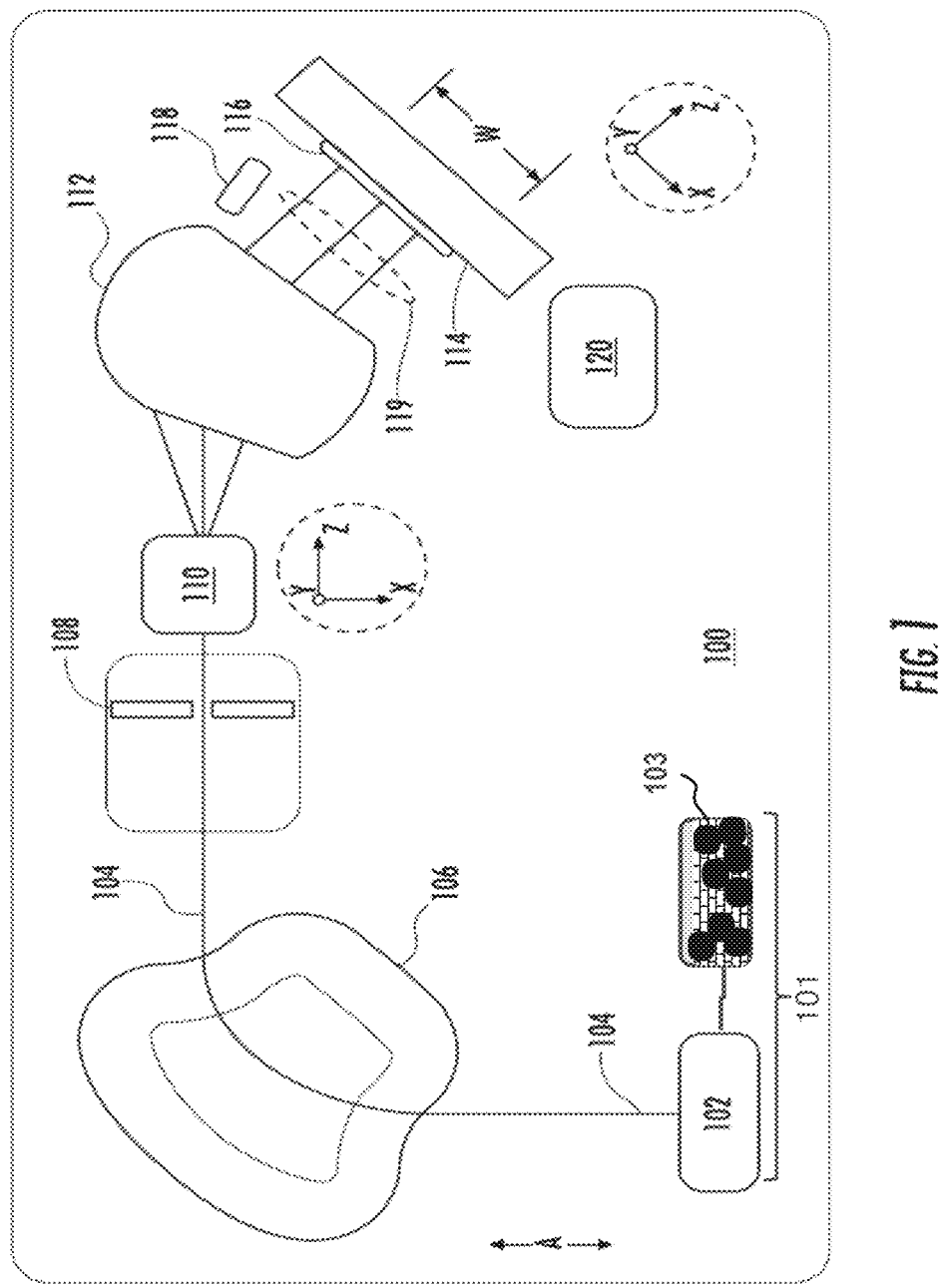
FIG. 1 depicts an ion implanter according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel approaches to forming high current metal ion sources, such as for ion implantation. In various embodiments, a metal ion source (which source may be simply referred to herein as an "ion source") employs a charge source such as a vaporizer having a charge formed from a composite mixture of a heterogenous metal-metal fluoride system that is to provide a source of the metal ions to be used, for example, in an ion implanter. As used herein the term "heterogeneous metal-metal fluoride system" may refer to a mixture of a metal and a metal fluoride where the element forming the metal fluoride is not the same as the element forming the metal. Likewise, in the context a given metal material in an ion source, a "heterogenous metal fluoride," a "heterogeneous metal fluoride compound," or a "heterogeneous metal fluoride portion" may refer to a metal fluoride material based upon a different metal element than the given metal material. Likewise, a "heterogeneous metallic element" may refer to a metallic element in a metal fluoride compound that is different from the given metal material in the ion source. Thus, in an aluminum metal ion source, a $CdF_2$ metal fluoride represents a heterogeneous metal fluoride with respect to the aluminum, and Cd represents a heterogeneous metallic element in comparison to the aluminum. In operation, this type of charge provides a chemistry suitable to reduce the vapor pressure by creating volatile sub-fluorides derived from those metals when the metals are heated and in liquid form. The reduced vapor pressure of liquid metal and generation of the volatile sub-fluorides for use as sources of metal ions may provide a better mechanism to control vapor of the feed for ion species to be implanted, such as dopant metal ions.

At the same time, the formation of the volatile sub-fluorides of a given metal species may increase metal ion beam current.

In particular embodiments highlighted below, an aluminum metal ion source is formed using a charge formed of metallic aluminum and a heterogeneous metal fluoride. As detailed below, certain heterogeneous metal fluorides may be especially suitable for improving performance in an aluminum metal ion source. While various embodiments discussed below detail the benefits of using a heterogeneous metal fluoride additive in conjunction with aluminum to improve aluminum ion source performance, additional embodiments are contemplated where a heterogeneous metal fluoride is added to improve other metal ion source performance, such as for La ion sources or Ga ion sources.

In various embodiments, a novel ion implanter and novel metal ion source and techniques for improving operation of a metal ion source are provided. FIG. 1 depicts an ion implanter according to embodiments of the disclosure. The ion implanter 100 is arranged as a beamline ion implanter, and may include various beamline components, as known in the art, in order to conduct an ion beam 104 from ion source 101. The ion source 101 may operate as a metal ion source, including a source of metal vapor, shown as charge source 103, and an ion chamber, shown as ion chamber 102, which chamber is coupled to receive metal vapor from the charge source 103. In some non-limiting embodiments, the charge source 103 may be a vaporizer or a retractable crucible. The ion chamber 102 may be an indirectly heated cathode source, an arc source, a plasma chamber, or other known ion source configuration. As such, the ion chamber 102 is coupled to receive metal vapor from the charge source 103, where the metal vapor provides a source of ion species for ion beam 104.

An ion beam 104 may be extracted from the ion source 101 as a metal ion beam, including ion species that contain a metal species received from the charge source 103, which metal species are to be implanted in a substrate 116. The ion beam 104 may be conducted down a beamline, where the ion beam 104 is mass analyzed, accelerated, decelerated, shaped, and steered toward a substrate stage 114 that supports or holds the substrate 116. The components of the ion implanter 100 shown in FIG. 1 are merely exemplary, and other components as well as additional known components may be included in the ion implanter 100 according to different embodiments. As shown, the ion implanter 100 may include a mass analyzer 106, which component may mass analyze and steer the ion beam 104, a mass resolving slit 108, a scanner 110 to scan the ion beam 104, particularly in embodiments where the ion beam 104 is generated initially as a spot ion beam. In other embodiments, the ion beam 104 may be generated as a ribbon ion beam where the scanner 110 is omitted. The ion implanter 100 may further include a collimator 112, to receive the scanned ion beam and direct the ion beam 104 as a ribbon ion beam 119 to the substrate 116. As such, the ion energy of the ion beam 104 may be set to achieve a target implantation depth for metal ions.

In various embodiments, the charge source 103 or similar charge sources, acts as a charge boosting source of vapor species to increase ion current and provide improved stability of operation for the ion source 101, as described in more detail below.

Figure 2:
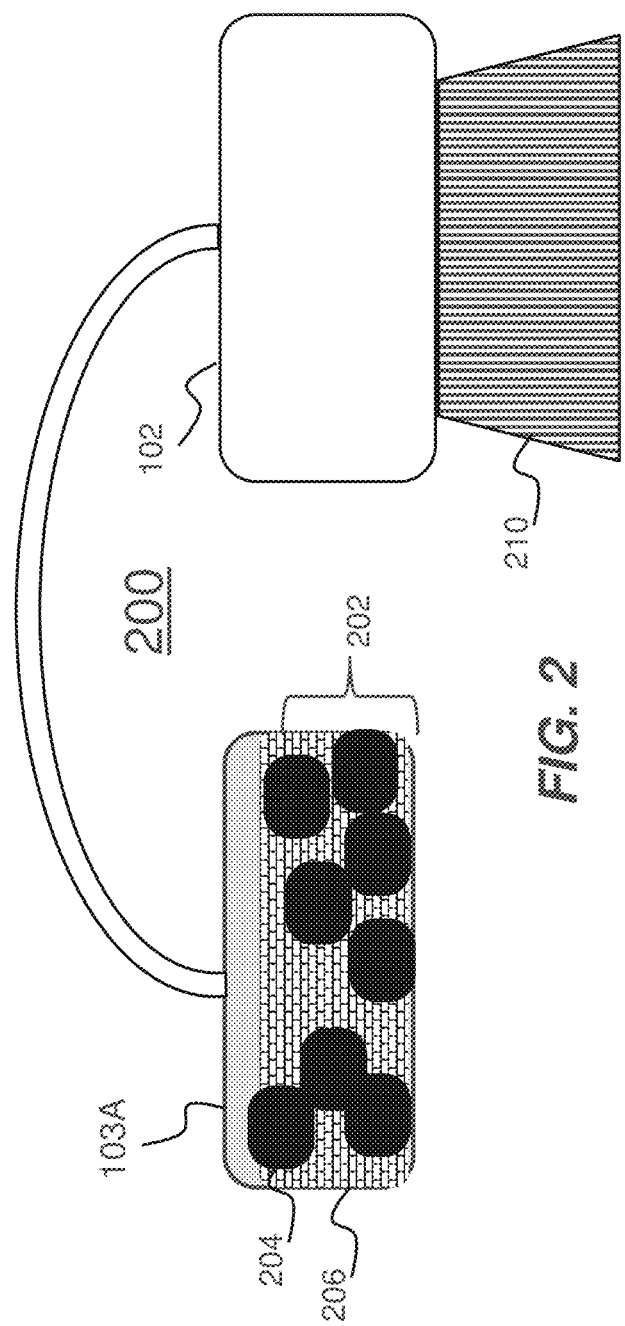
FIG. 2 depicts an ion source according to embodiments of the disclosure.

FIG. 2 depicts details of an ion source 200 according to embodiments of the disclosure. In this example, the ion chamber 102 is coupled to a charge source 103A, that includes a charge mixture 202. The charge mixture 202 may include a first portion 204 that is an elemental metal, and a second portion 206 that is a heterogeneous metal fluoride. These portions may be provided each in a solid phase at room temperature when arranged within the charge source 103A. For example, one or more of the first portion 204 and the second portion 206 may be provided in powder form, in pellet form, and in some cases may be mixed together in the solid state to form a uniform mixture. In particular embodiments for an aluminum ion source, the first portion 204 may be elemental aluminum metal, while the second portion 206 is a heterogeneous metal fluoride, where variants of a heterogeneous metal fluoride are discussed below.

In operation, the charge source 103A may be heated in a manner to generate a series of reactions that serve to generate a volatile (gas phase) fluoride species of the metal species to be extracted from ion chamber 102, in order to form a metal ion beam 210. As an example for an aluminum ion beam, when the charge source 103A is operated at an operating temperature the charge mixture 202 may include aluminum and a heterogeneous metal fluoride that react to form an aluminum vapor including an aluminum sub-fluoride in gas phase. The aluminum vapor may then be transported to the ion chamber 102, ionized in the ion chamber 102, and extracted from the ion chamber 102 as metal ion beam 210. As used herein the terms "aluminum vapor" or "metal vapor" may refer to a vapor or gas phase material or mixture that includes aluminum or metal species, respectively. For example, and aluminum vapor may refer to a gas phase mixture of aluminum fluoride, aluminum sub-fluoride, and/or elemental aluminum vapor. By providing a suitable heterogeneous metal fluoride material for second portion 206, the charge source 103A may be operated more stably and may serve to boost the overall current of aluminum ions extracted to form the metal ion beam 210.

Figure 3A:
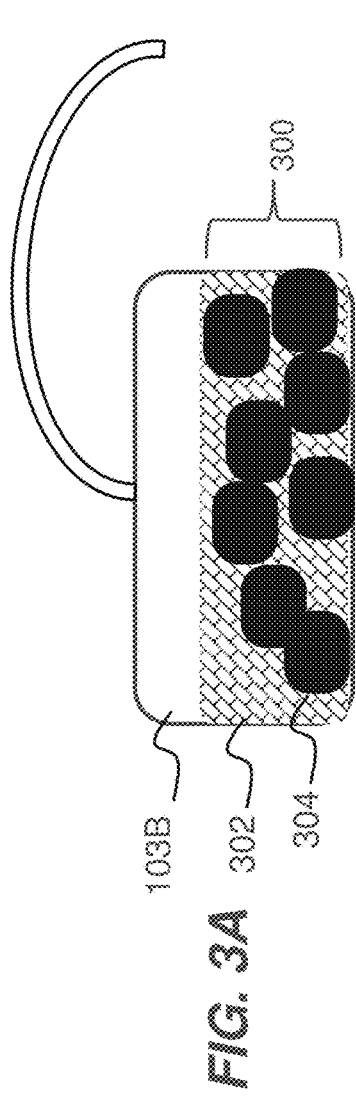
FIG. 3A depicts a side view of a charge source at one instance of operation, according to embodiments of the disclosure.
Figure 3B:
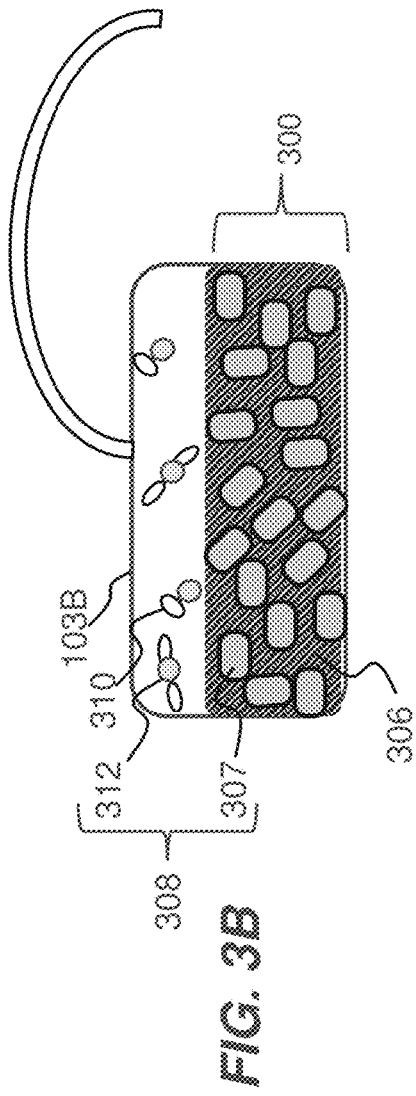
FIG. 3B depicts a side view of the charge source of FIG. 3A at another instance of operation, according to embodiments of the disclosure.
Figure 3C:
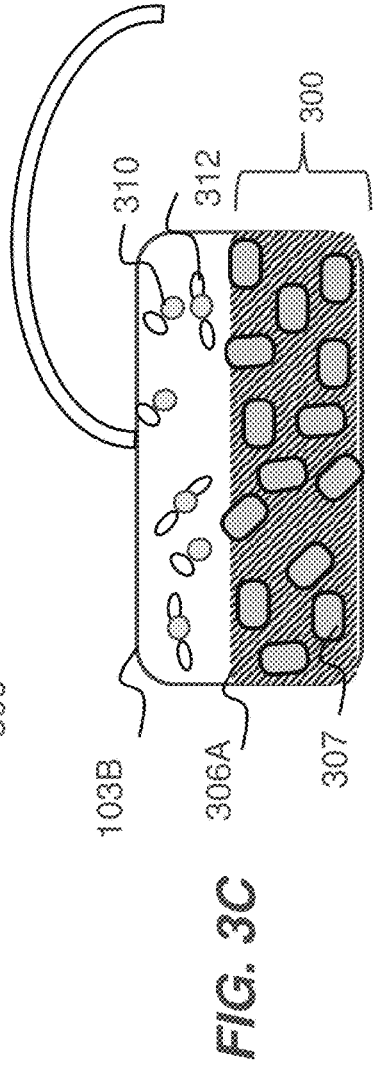
FIG. 3C depicts a side view of the charge source of FIG. 3A at a further instance of operation, according to embodiments of the disclosure.

To further explain a charge source operation, FIG. 3A depicts a side view of a charge source at one instance of operation, according to embodiments of the disclosure; FIG. 3B depicts a side view of the charge source of FIG. 3A at another instance of operation, according to embodiments of the disclosure; and FIG. 3C depicts a side view of the charge source of FIG. 3A at a further instance of operation, according to embodiments of the disclosure. The charge source 103B in this example includes a charge mix 300 that contains, at the stage of FIG. 3A, a solid metal portion 302 and a heterogeneous metal fluoride portion 304, which portion may also be in solid form. At this stage, the charge source 103B may have been prepared and not previously operated at an operation temperature. As such, the charge mix 300 may have been loaded into the charge source 103B in advance of an ion implantation run.

At the stage of FIG. 3B, the charge source 103B has been heated and at least one reaction has taken place among the different components of the charge mix 300 at the stage of FIG. 3A. The reaction may form a different combination of substances than are present in the stage at FIG. 3A. The nature of the combination of substances that may form at this stage of FIG. 3B may depend upon the chemical properties and thermodynamic properties of the solid metal portion 302 and the heterogeneous metal fluoride portion 304, for example the solid metal portion 302 may be in a liquid state at this stage.

In accordance with various embodiments, the heterogeneous metal fluoride portion 304 of the charge mix 300 of FIG. 3A may be chosen based upon the relative free energy of formation $\Delta G_f$ of the heterogeneous metal fluoride with respect to the free energy of formation of a fluoride compound of the metal of solid metal portion 302. In various embodiments of an aluminum ion source, where the solid metal portion 302 is elemental aluminum, the heterogeneous metal fluoride compound may be characterized by a free energy of formation that is greater than, or less thermodynamically favorable than the free energy of formation of aluminum fluoride, or $AlF_3$. More particularly, over a designed operation temperature range of the charge source 103B, the free energy of formation of $AlF_3$ may have a greater negative value than the free energy of the heterogeneous metal fluoride. Generally, the free energy of formation is known as a function of temperature for many metal fluorides. This data may be derived from known thermodynamic data tables or presented in well-known Ellingham diagrams illustrating the free energy of formation as a function of temperature for various fluorides, including $AlF_3$. Examples of curves representing the free energy of formation for several metal fluorides having a lesser free energy of formation than the curve for $AlF_3$ are known, meaning a less negative value of $\Delta G_f$ over a temperature range such as between room temperature up to 1800 K. This temperature range may encompass the range of temperatures for operating a charge source, such as charge source 103B. For example, the metal fluoride $CdF_2$, among others, has a lesser free energy of formation than $AlF_3$, meaning the $CdF_2$ curve lies above the $AlF_3$ curve, over the entire temperature range shown, and in this case by approximately 50 kcal/gfw between 0 and 1040 K. This same conclusion can be reached by constructing thermodynamic cycles using information obtained from thermodynamic tables, such as those provided by the National Institute of Standard and Technology. The significance of this fact is that the compound $AlF_3$ will be more stable than $CdF_2$, and thus, $AlF_3$ may tend to form when elemental aluminum is brought into reaction with a heterogeneous metal fluoride, such as $CdF_2$. The same applies to $BiF_3$, $AsF_5$, and $SbF_5$, to a name a few additional heterogeneous metal fluorides, all exhibiting a lesser free energy of formation than $AlF_3$.

Returning to the example of FIG. 3B, the charge mix 300 now includes a reacted portion 308 and a liquid portion 306. As detailed below, the reacted portion 308 may include a solid phase 307, as well as gaseous species. In embodiments of aluminum ion sources, the reacted portion 308 may include aluminum sub-fluorides, such as AlF or $AlF_2$, that form directly from the reaction of the solid metal portion 302 with heterogeneous metal fluoride portion 304, while the liquid portion 306 represents an alloy or other mixture of aluminum and a heterogeneous metal that is derived from the heterogeneous metal fluoride portion 304. In some examples, the heterogeneous metal fluoride portion 304 may be a difluoride or a trifluoride and may react with aluminum metal to form a metallic liquid mixture of the heterogeneous metal element and aluminum, as well as a phase of AlF or $AlF_2$. For example, a gallium-based heterogeneous metal fluoride ($GaF_3$) mixed with aluminum metal at 1200 K may form an aluminum sub-fluoride, AlF ($\Delta G°_{[A]} = -19.88$ kJ), according to:

$$GaF_{3(S)} + 3Al_{(L)} \rightarrow 3AlF_{(G)} + Ga_{(L)} \quad [A]$$

In this same system, the reaction of $GaF_3$ and Al under the same operating temperature of 1200 K, should not form $AlF_2$, ($\Delta G°_{[B]} = +0.810$ kJ), according to:

[B]

Co-generation of AlF and $AlF_2$ in this example system is possible at a temperature of 1200K ($\Delta G°_{[C]} = -6.089$ kJ), according to:

$$GaF_{3(S)} + 2Al_{(L)} \rightarrow AlF_{(G)} + AlF_{2(G)} + Ga_{(L)} \quad [C]$$

The generation of the di-fluorine containing aluminum sub-fluoride, $AlF_2$, at a temperature of 1200 K opens an additional reaction pathway for the formation of AlF ($\Delta G°_{[D]} = -13.80$ kJ), according to:

$$AlF_{2(G)} + Al_{(L)} \rightarrow 2AlF_{(G)} \quad [D]$$

This process is advantageous as the reaction has directly created aluminum sub-fluorides that have a lower vapor pressure than either Al or $GaF_3$. This reaction means the Al charge vapor can be realized at lower overall temperatures.

In another example of charge mixture using initially a heterogeneous metal trifluoride ($MeF_3$) and aluminum, the reaction may proceed generally as:

$$MeF_3 + Al_{1+x} \rightarrow AlF_3 + Al_xMe_{1-x(Liquid)} \quad [E]$$

Note that a metal difluoride ($MeF_2$) may react with aluminum similarly to generate $AlF_3$+an aluminum-heterogeneous metal liquid mixture. In this example, the reacted portion 308 may include $AlF_3$ in the solid phase 307.

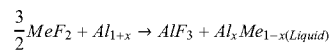

Note that in the aforementioned example where the reacted portion 308 includes aluminum sub-fluorides, such as AlF or $AlF_2$, that form directly from the reaction of the solid metal portion 302 with heterogeneous metal fluoride portion 304, the aluminum sub-fluorides may rapidly evolve into a gas phase according to the reaction temperature. This circumstance is represented in FIG. 3B where the reacted portion 308 may include gas species 310 representing AlF, and gas species 312 representing $AlF_2$.

Turning now to FIG. 3C, the charge mix 300 the reacted portion 308 is still present, while the liquid portion 306A represents the liquid portion 306 at a later stage where the composition of liquid portion 306 may have altered. At this stage more gaseous species have evolved within the charge source 103B, which species may be used as vapor for ionization in an ion chamber. In embodiments of an aluminum ion source, the gaseous species may include species of aluminum sub-fluorides, where gas species 310 represents AlF, and gas species 312 represents $AlF_2$, discussed above. In addition to the direct formation from the reaction of aluminum and a heterogeneous metal fluoride, as represented in FIG. 3B, the gas species may form as a result of aluminum in the liquid portion 306 reacting with $AlF_3$ (as represented by solid phase 307) to form an aluminum sub-fluoride. For example, the reaction of $AlF_3$ and Al at a temperature of 1200 K may form an aluminum sub-fluoride, AlF ($\Delta G°_{[F]} = -9.79$ kJ), according to:

$$AlF_{3(S)} + 2Al_{(L)} \rightarrow 3AlF_{(G)} \quad [F],$$

In this same system, the reaction of $AlF_3$ and Al under an operating temperature of 1200K should not form a difluorine containing aluminum sub-fluoride, $AlF_2$, ($\Delta G°_{[G]} = +10.895$ kJ), according to:

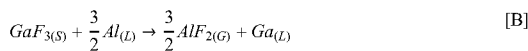
[G]

Additionally, the co-generation of different sub-fluorides (AlF, AlF$_2$) from the reaction of AlF$_3$ and Al under the same operating conditions at 1200 K, should not occur due to the thermodynamic unfavourability of the reaction ($\Delta G°_{[H]}$=+ 3.996 kJ), according to:

$$AlF_{3(S)} + Al_{(L)} \rightarrow AlF_{(G)} + AlF_{2(G)} \qquad [H]$$

Thus, in the example of FIGS. 3B and 3C, volatile aluminum sub-fluorides may form directly from the reaction of aluminum with a heterogeneous metal fluoride, as well as indirectly from a reaction of aluminum and heterogeneous metal fluoride to generate AlF$_{3(S)}$ and a subsequent reaction of the AlF$_{3(S)}$ with remaining aluminum in the charge.

Thus, the provision of a solid heterogeneous metal fluoride and aluminum as a charge mixture for an ion source may lead directly to the formation of aluminum vapor for the ion source, in the form of volatile aluminum sub-fluorides. A goal of this approach is that overall ion current in the ion source may be increased over the ion current obtained from a charge based upon a pure metal, such as pure aluminum. For example, it has been previously shown that using a mixture of aluminum and AlF$_3$ as initial charge material may increase the aluminum ion current in an ion source.

A benefit of using a mixture of a heterogeneous metal fluoride with aluminum as initial charge material rather than aluminum and AlF$_3$, is that many more reaction pathways for the formation of aluminum sub-fluorides become viable. According to thermodynamic calculations, the relative instability in the formation of certain metal fluoride compounds in comparison to AlF$_3$ as measured by the standard Gibbs free energy (G) provides sufficient thermodynamic driving force for otherwise unfavorable reactions. Since a goal is to form Al sub-fluorides, for use as volatile precursors to aluminum ions, this consideration means that a mixture of heterogeneous metal fluoride with aluminum is more optimal than a mixture of AlF$_3$ and Al.

An additional advantage of adding solid heterogeneous metal fluorides to aluminum as charge material in an aluminum ion source, for example, is that the use of a different metal species provided by the heterogeneous metal fluoride may offer improved charge source operation flexibility. In particular, when the heterogeneous metal fluoride and aluminum are reacted to form the liquid portion an alloy or multiphase mixture of aluminum and metal element from the heterogeneous metal fluoride may form, where the melt characteristics are determined at least in part by the metal element of the heterogeneous metal fluoride. For example, in an embodiment where the heterogeneous metal fluoride portion 304 is GaF$_3$ or InF$_3$, the melting temperature of a subsequently formed liquid portion formed from a mixture of the respective heterogeneous metal element and Al, meaning the liquid portion 306, will be lower than the melting temperature of pure Al, in accordance with the well-known binary phase diagrams of Ga—Al or In—Al. Thus the useful temperature range for such a charge source formed of GaF$_3$ or InF$_3$ may be adjusted, and in general, may be greater than that of a pure aluminum charge source.

In accordance with particular embodiments of the disclosure, the heterogeneous metal fluoride compound used in a charge source may be one of: CdF$_2$, InF$_3$, and GaF$_3$. These particular materials may satisfy several criteria that favor use as charge source material in conjunction with elemental aluminum, for an aluminum ion source. In these embodiments, after the reaction with elemental aluminum, the resulting liquid portion, may be a phase or phases that is generally an aluminum-containing metallic liquid phase mixture represented by Al$_x$Ga$_{1-x}$, Al$_x$In$_{1-x}$, or Al$_x$Cd$_{1-x}$.

Again, according to the previous discussion, a concomitant solid phase expected to be formed together with this liquid phase is AlF$_3$. Since AlF$_3$ is solid up to the melting temperature of 1290° C., the charge source may be operated stably at a relatively wide range of temperatures below this AlF$_3$ melting temperature and above the melting temperature of the aluminum-heterogeneous metal element mixture.

Among useful properties of charge sources formed from mixtures of heterogeneous metal fluorides and aluminum, are the melting temperature of the heterogeneous metal fluorides. Table I provides a listing of some exemplary melt properties of suitable heterogeneous metal fluorides.

TABLE I

| Melt properties of exemplary metal fluorides | | |
|---|---|---|
| Element | State @ RT | T$_{melt}$ (C.) |
| GaF$_3$ | S | 800 |
| InF$_3$ | S | 1172 |
| CdF$_2$ | S | 1110 |

As shown in Table I, the listed fluorides all have melting temperatures of 800° C. or greater, which temperature may be substantially higher than the operating temperature of a charge source. The alloy mixtures of aluminum with the metal elements of the listed heterogeneous metal fluorides all exhibit melting temperatures below that of aluminum (660° C.) and thus, a charge source containing the heterogeneous metal fluoride and aluminum may be operated at a range of temperatures to form a melt that are well below the melting temperature of given heterogeneous metal fluoride. This property is useful in that fluorine loss may be avoided when the charge source is being heated prior to reaching the operating temperature. Said differently, were the heterogeneous metal fluoride to melt before the aluminum reaches a temperature sufficient to initiate melting, fluorine may be expected to evolve from the liquid heterogeneous metal fluoride, leading to loss of control of the charging process.

Moreover, while elements such as Ga, Cd, and In may be deemed undesirable if implanted into a substrate, in embodiments of ion implantation using aluminum as a dopant source for implantation into semiconductors, the elements, Ga, Cd, and In are able to be easily filtered out of the ion beam and do not pose a risk to the Al implant process. This ability to filter out such species is shown in table II, listing the mass/charge (m/q) ratio of ionized species of these elements in comparison to the m/q ratio of aluminum ions.

TABLE II

| Mass/charge ratios for selected ion species of various elements | | | |
|---|---|---|---|
| Element | Charge State | Mass (AMU) | m/q |
| Al | 1 | 26.98 | 26.98 |
|  | 2 | 26.98 | 13.49 |
|  | 3 | 26.98 | 8.99 |
|  | 4 | 26.98 | 6.74 |
| In | 1 | 114.82 | 114.82 |
|  | 2 | 114.82 | 57.41 |
|  | 3 | 114.82 | 38.27 |
| Cd | 1 | 112.41 | 112.41 |
|  | 2 | 112.41 | 56.20 |
|  | 3 | 112.42 | 37.47 |
| Ga | 1 | 69.72 | 69.72 |
|  | 2 | 69.72 | 34.86 |
|  | 3 | 69.72 | 23.24 |

Since there is no overlap in m/q ratio of these heterogeneous metal ions with aluminum ions, a mass analyzer may readily filter out such heterogeneous metal ions, downstream of an ion source, in the event that volatile vapor containing the heterogeneous metal species enter an ion chamber from the charge source, and are subsequently ionized and extracted.

Figure 4:
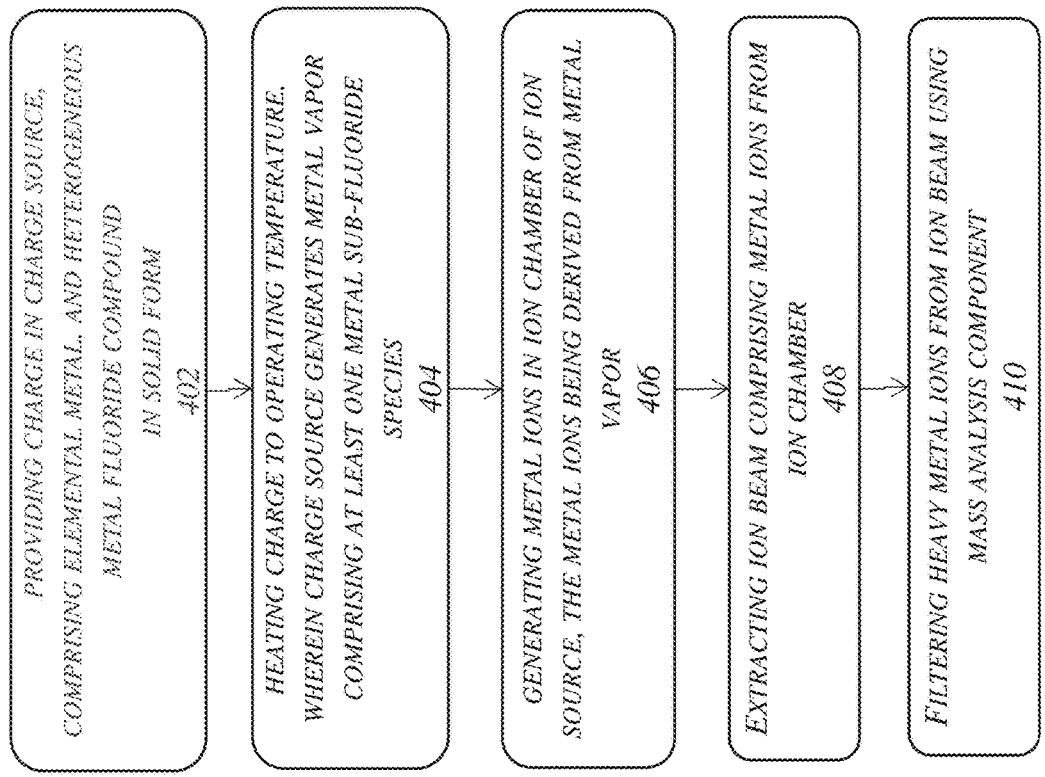
FIG. 4 depicts an exemplary process flow.

FIG. 4 depicts an exemplary process flow 400. At block 402, a charge is provided in a charge source, where the charge is formed of a charge mixture including an elemental metal, such as aluminum, and a heterogeneous metal fluoride compound. The different substances of the charge may all be in solid form at room temperature. As such, the charge mixture may be conveniently placed in any suitable charge source, including a vaporizer, or a retractable crucible source.

At block 404, the charge in the charge source is heated to an operating temperature, where the charge source generates a metal vapor. In one embodiment of an aluminum charge source, an aluminum vapor is generated that includes at least one aluminum sub-fluoride vapor species, such as AlF or $AlF_2$. In one example where the heterogeneous metal fluoride is a trifluoride ($MeF_3$) an aluminum sub-fluoride vapor species $AlF_{(G)}$ may be generated in a series of reactions, as generally shown below:

$$MeF_{3(S)} + Al_{1-x(L)} \rightarrow AlF_3(G) + Al_xMe_{1-x(Liquid)} \quad [1]$$

$$AlF_{3(S)} + 2Al_{(L)} \rightarrow 3AlF_{(G)} \quad [2],$$

as well as the following series of reactions:

$$MeF_{3(S)} + Al_{3+x(L)} \rightarrow 3AlF_{(G)} + Al_xMe_{1-x(Liquid)} \quad [3]$$

and:

$$MeF_{3(S)} + Al_{2+x(L)} \rightarrow AlF_{(G)} + AlF_{2(G)} + Al_xMe_{1-x(Liquid)} \quad [4]$$

$$AlF_{2(G)} + Al_{(L)} \rightarrow 2AlF_{(G)} \quad [5]$$

Note that the elemental aluminum represented in Eq [2] may be derived from the liquid mixture of aluminum and heterogeneous metal element ($Al_xMe_{1-x(Liquid)}$). Note also that the aluminum vapor may also include elemental aluminum vapor species that evolve from the $Al_xMe_{1-x(Liquid)}$ material.

At block 406, metal ions are generated in an ion chamber of an ion source, where the metal ions are derived from the metal vapor created in the charge source. As noted a metal vapor such as aluminum vapor may include metal sub-fluorides as well as elemental metal vapor species. The charge source may be coupled to the ion chamber where the metal sub-fluorides as well as elemental metal vapor evolved during heating of the charge source are transported into the ion chamber. As such, the density of metal ions such as aluminum ions may be higher than the density of metal ions generated from a charge made of pure elemental metal.

At block 408, and ion beam is extracted from the ion chamber, where the ion beam includes the metal ions. Note that during the generation of aluminum sub-fluoride vapor, other gas phase species including heterogeneous metal elements may be generated in the charge source, admitted into the ion source, and subsequently ionized in the ion source.

At block 410, the filtering of any heterogeneous metal ions from the ion beam is performed using a mass analysis component, disposed downstream of the ion source. The mass analyzer component may be a known magnetic device, where the different ions having different m/q ratios are deflected along different arcs, in order to transmit just select ions of select m/q ratio. As such, the elemental metals for group of heterogeneous metal fluorides selected for the charge mixture may be chosen so that the metallic ions of any given charge state of the heterogeneous metal elements do not have m/q ratios that overlap with the m/q ratios of the various metal ion charge states for metal ions that are singly, doubly, triply ionized, etc. Accordingly, a pure metal ion beam, such as an aluminum ion beam, may be transported to a substrate for implantation, while the heterogeneous metal ions are screened out.

The present embodiments provide several advantages in respect to current approaches for metal source ion implantation. As a first advantage, the use of heterogeneous metal fluoride additives to a metal charge, such as an aluminum charge material in a charge source may actually generate higher yield overall of metal-containing vapor, and thus higher metal ion beam current in an ion chamber, as compared to using a pure elemental metal charge. As a second advantage, a charge source operated according to the charge mixtures of the present embodiments may operate at a lower overall temperature, providing for more consistent ion source performance, fewer failures, and better overall control of metal vapor production.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An ion source, comprising:
an ion chamber to generate an ion beam comprising a metal ion species; and
a charge source, coupled to deliver a metal vapor to the ion chamber, the charge source including a charge mixture, the charge mixture comprising:
a first portion, comprising an elemental metal; and
a second portion, comprising a heterogeneous metal fluoride compound.

2. The ion source of claim 1,
wherein the metal ion species is aluminum,
wherein the heterogeneous metal fluoride compound is characterized by a first curve defining free energy of formation as a function of temperature over a charge source operating temperature range, and
wherein aluminum fluoride ($AlF_3$) is characterized by a second curve, defining free energy of formation as a function of temperature over the charge source operating temperature range, the second curve lying below the first curve.

3. The ion source of claim 2, wherein the heterogeneous metal fluoride compound comprises one of: $CdF_2$, $InF_3$, and $GaF_3$.

4. The ion source of claim 1, wherein the elemental metal comprises Ga and wherein the heterogeneous metal fluoride compound comprises $AlF_3$ or $InF_3$.

5. The ion source of claim 1, wherein the elemental metal comprises La and the heterogeneous metal fluoride compound comprises $AlF_3$, $CdF_2$, or $InF_3$.

6. The ion source of claim 1, wherein during operation the charge source comprises an aluminum-containing metallic liquid phase comprising $Al_xGa_{1-x}$, $Al_xIn_{1-x}$, or $Al_xCd_{1-x}$.

7. The ion source of claim 6, wherein during operation, the charge source further comprises at least one aluminum sub-fluoride.

8. An ion implanter, comprising:
an ion source, configured to generate a metal ion beam comprising a plurality of metal ions, the ion source comprising:
an ion chamber to generate an ion beam comprising a metal ion species; and
a charge source, coupled to deliver a metal vapor to the ion chamber, the charge source comprising a charge mixture, the charge mixture comprising:
a first portion, comprising an elemental metal; and
a second portion, comprising a heterogeneous metal fluoride compound formed from a heterogeneous metallic element, different from the elemental metal; and
a mass filter, disposed downstream of the ion source, and configured to filter out from the metal ion beam a set of impurity ions containing the heterogeneous metallic element.

9. The ion implanter of claim 8, wherein the elemental metal comprises aluminum and the heterogeneous metal fluoride compound comprises one of: $CdF_2$, $InF_3$, and $GaF_3$.

10. The ion implanter of claim 9, wherein during operation, the charge mixture comprises an aluminum-containing metallic liquid phase.

11. The ion implanter of claim 10, the aluminum-containing metallic liquid phase comprising $Al_x Ga_{1-x}$, $Al_xIn_{1-x}$, or $Al_xCd_{1-x}$.

12. The ion implanter of claim 11, wherein during operation, the charge source further comprises at least one aluminum sub-fluoride.

13. The ion implanter of claim 12, wherein the metal ions comprise elemental aluminum ions, comprising a set of aluminum mass/charge ratios, wherein the impurity ions comprise elemental metal ions of the heterogeneous metallic element, comprising a set of impurity ion mass/charge ratios, wherein the set of aluminum mass/charge ratios does not overlap the set of impurity ion mass/charge ratios.

14. The ion implanter of claim 8, wherein the heterogeneous metal fluoride compound comprises $AlF_3$ and wherein the elemental metal comprises La or Ga.

15. A method of operating a metal ion source, comprising:
providing a charge mixture in a charge source, the charge source comprising a vaporizer or a retractable crucible, the charge mixture comprising a first portion, comprising an elemental metal, and a second portion, comprising a heterogeneous metal fluoride compound in solid form;
heating the charge mixture to an operating temperature, wherein the charge source generates a metal vapor comprising at least one metal sub-fluoride species; and
generating metal ions in an ion chamber of the metal ion source, the metal ions being derived from the metal vapor.

16. The method of claim 15, wherein the elemental metal comprises aluminum and the heterogeneous metal fluoride compound comprises one of: $CdF_2$, $InF_3$, and $GaF_3$.

17. The method of claim 16, wherein the metal vapor comprises at least one of: AlF and $AlF_2$, and wherein during the heating the charge mixture, the metal vapor forms at least in part from directly reacting the heterogeneous metal fluoride compound with aluminum.

18. The method of claim 16, wherein the metal vapor comprises at least one of: AlF and $AlF_2$, and wherein during the heating the charge mixture, the metal vapor forms at least in part from firstly reacting the heterogeneous metal fluoride compound with aluminum to form an AlF3 solid an aluminum-containing liquid, and secondly from reacting the AlF3 solid with the aluminum-containing liquid to form the metal vapor.

19. The method of claim 15, wherein during the heating the charge mixture, the metal vapor forms from reaction of the $AlF_3$ material with an aluminum-containing metallic liquid phase, and wherein the metal vapor comprises at least one of: AlF and $AlF_2$.

20. The method of claim 15, wherein the metal ions comprise elemental aluminum ions, comprising a set of aluminum mass/charge ratios, and wherein the set of aluminum mass/charge ratios does not overlap a set of impurity ion mass/charge ratios, characteristic of a set of impurity ions derived from metal elements of the heterogeneous metal fluoride compound, the method further comprising:
filtering the set of impurity ions using a mass analyzer, disposed downstream to the metal ion source.

* * * * *